United States Patent [19]

Jacoby et al.

[11] Patent Number: 4,695,215

[45] Date of Patent: * Sep. 22, 1987

[54] DEVICE FOR AUTOMATICALLY TRANSPORTING DISK SHAPED OBJECTS

[75] Inventors: Hans-Dieter Jacoby, Werdorf; Peter Schmidt, Huettenberg, all of Fed. Rep. of Germany

[73] Assignee: Ernst Leitz Wetzlar GmbH, Wetzlar, Fed. Rep. of Germany

[*] Notice: The portion of the term of this patent subsequent to Feb. 26, 2002 has been disclaimed.

[21] Appl. No.: 688,419

[22] Filed: Jan. 2, 1985

Related U.S. Application Data

[62] Division of Ser. No. 494,706, May 16, 1983, Pat. No. 4,501,527.

[30] Foreign Application Priority Data

May 25, 1982 [DE] Fed. Rep. of Germany ....... 3219502

[51] Int. Cl.⁴ .............................................. B65H 5/00
[52] U.S. Cl. .................................. 414/225; 414/331; 414/744 B; 414/752
[58] Field of Search ........... 414/222, 223, 225, 744 R, 414/744 B, 749, 752, 331, 416; 198/486, 339, 468.4, 346.2

[56] References Cited

U.S. PATENT DOCUMENTS

| | | | |
|---|---|---|---|
| 2,711,817 | 6/1955 | Hautau et al. ................... | 198/339.1 |
| 3,466,514 | 9/1969 | Brunner et al. ................ | 414/754 X |
| 3,645,581 | 2/1972 | Lasch et al. .......................... | 414/752 |
| 3,823,836 | 7/1974 | Cheney et al. ..................... | 414/225 |
| 3,968,885 | 7/1976 | Hassan et al. ........................ | 414/591 |
| 4,062,463 | 12/1977 | Hillman et al. ..................... | 414/225 |
| 4,253,891 | 3/1981 | Brussel ............................. | 414/752 X |
| 4,336,438 | 6/1982 | Uehara et al. ................... | 414/222 X |
| 4,373,840 | 2/1983 | Miller, Jr. ......................... | 414/225 |
| 4,407,627 | 10/1983 | Sato et al. ........................ | 414/754 X |
| 4,427,332 | 1/1984 | Manriquez ......................... | 414/331 |

FOREIGN PATENT DOCUMENTS 2539036 3/1976 Fed. Rep. of Germany .
2542047 9/1981 Fed. Rep. of Germany .

OTHER PUBLICATIONS

Plat–General, Inc., brochure entitled "Model #350 Inspection Machine", 26 Jan. 1973.
Convac GmbH, brochure entitled "Convac CKA2".

*Primary Examiner*—Frank E. Werner
*Assistant Examiner*—Donald W. Underwood
*Attorney, Agent, or Firm*—Schwartz, Jeffery Schwaab, Mack, Blumenthal & Evans

[57] ABSTRACT

Device for the automatic transport of disk shaped objects from a discharge cassette adjustable in height through a position adjusting station to an inspection table and further into depository cassettes which are also adjustable in height in a step-wise manner. According to the invention, between the discharge cassette and the position adjusting station a linearly displaceable transport arm gripping the disk shaped objects eccentrically and between the position adjusting station and the inspection table a pivoting lever again gripping the disk shaped objects eccentrically, and within the working range of the pivoting lever additionally on a rotating plate a slide displaceable to and from in the radial direction and gripping the disk shaped objects eccentrically, are provided and the depository cassettes are arranged with their orifices at the circumference of the rotating disk.

12 Claims, 4 Drawing Figures

DEVICE FOR AUTOMATICALLY TRANSPORTING DISK SHAPED OBJECTS

This is a division of application Ser. No. 494,706, filed May 16, 1983, now U.S. Pat. No. 4,501,527.

BACKGROUND OF THE INVENTION

The present invention relates to a device for automatically transporting disk shaped objects from a discharge cassette, which is step-wise adjustable in height, through a position adjusting station to an inspection table for inspection and further, after the inspection is completed, into different depository cassettes, which are also adjustable in height in a step-wise manner.

Devices of this type are employed in particular in the production of semiconductors for inspecting the surface of wafers between steps in the semiconductor manufacturing process. The wafers are held in standard cassettes, and inserted in the transport device so that the wafers are in a horizontal position. In order to prevent contamination, efforts are made to avoid touching the surface of the wafers as much as possible during the automatic transportation process.

The transport mechanisms used generally are belt drives and air cushion guides. In the case of belt drives, during the discharge from the discharge cassette, at various transfer points, and during insertion in the depository cassettes, contamination of the bottom side of the wafers, for example, by abrasive particles on moving parts of the drive, cannot be avoided. As the cassettes are discharged successively from the bottom and loaded in reverse order, such impurities may drop from the bottom side of one wafer onto the top side of the wafer beneath it. Additional problems arise at the transfer points, because the transport motion of the wafers is terminated by stoppers, against which the edges of the wafers abut. This results in a risk that, for example, the particles of the photoresist on the wafer are spalled off and possible remain on the surface of wafers.

The aforementioned potential modes of contamination exist in the course of the entire transport path. Contamination occurring prior to the inspection may be discovered with a certain probability, but contamination encountered after this remains undiscovered and in the course of subsequent process steps leads to production of poor quality products.

In the case of air cushion guidance there are problems related to the cleanliness of air and the turbulence of the external air created by the outflow. Therefore, here again the settling of dirt particles on the top side of wafers cannot be avoided. Furthermore, air cushions always require a lateral guidance of the wafers disks by mechanical means so that both during impact at transfer points and against the lateral guides, spalling of photoresist particles is possible, which further enhances the danger of contamination in view of the existing air turbulence. The occasional impact of the wafers on the nozzle holders also leads to unacceptable damage to the wafers. Thus, in place of a reduction of the reject ratio by means of the early detection of defects, there is a risk that the transport to the inspection station will introduce additional defects.

A problem common to both transport mechanisms consists of the fact that they must be mounted directly under the cassettes in order to receive the wafers. The table upon which the cassette is mounted may be adjusted in height in a step-wise manner in order to bring the wafers successively into their discharge and loading positions, respectively, and must therefore be provided with suitable recesses. Further, the belt drive must be lowered following the receipt of a wafer.

A further common problem is represented by the fact that the wafers undergo undefined rotating movements both during the discharge and the transport so that for inspection, for example, under a microscope, an additional alignment procedure is always required. There are therefore certain known devices wherein the wafers are initially moved to a position adjusting unit. The latter aligns the round wafer disks in relation to a ground, straight section (flat portion). In order to transfer the wafer to the inspection table it is brought initially into a definite position with respect to the aligning unit. Subsequently, the wafer is seized by suction by its top side and placed onto the inspection table by means of an arm, which is linearly displaceable or rotates around an axis of rotation. The discharge of the wafer from the inspection table is again effected by a belt drive built into the table or by air cushion guidance, so that the table must be aligned specifically in relation to the path of the outgoing transport. The necessary correlation of the inspection table with both the incoming and outgoing wafer transportation systems leads to the fact that heretofore all functional units were combined in a single combined apparatus.

SUMMARY OF THE INVENTION

It is an object of the present invention to provide a device which transports disk shaped objects from a discharge cassette to a final deposition point following inspection without subjecting the objects to risk of contamination.

Another object of the present invention is to provide a device for transporting disk shaped objects which operates automatically without requiring any manual handling of the objects.

A further object of the present invention is to provide a device for transporting disk shaped objects which is designed to be produced in a modular configuration of functional units each of which requires alignment with a single other unit only.

In accordance with the above and other objects, the present invention is a system for operating on disk shaped objects comprising: a discharge cassette, means for adjusting the height of the discharge cassette, a position adjusting station, an inspection table, depository cassettes, and means for adjusting the height of the depository cassettes, and a device for automatically transporting the disk shaped objects from the discharge cassette through the position adjusting station to the inspection station and further into one of the depository cassettes. The transporting device comprises a linearly displaceable transport arm disposed between the discharge cassette and the position adjusting station. Means are provided on the linearly displaceable transport arm for eccentrically gripping one of the disk shaped objects. A pivotal lever is provided having a working range between the adjusting station and the inspection station, and means are provided on the pivotal lever for eccentrically gripping one of the disk shaped objects. A rotating plate is provided and a slide is mounted on the rotating plate for radial movement into the working range of the pivotal lever. Means are provided on the slide for eccentrically gripping one of the disk shaped objects. The depository cassettes have openings positioned adjacent the periphery of the rotating plate for receiving disk shaped objects from the slide.

The discharge cassette, the position adjusting station and the inspection table are aligned with each other during transfer of a disk shaped object and the pivoting lever has a pivoting axle which coincides with the alignment.

In accordance with other aspects of the invention the means for adjusting the height of the discharge cassette and the means for adjusting the height of the depository cassettes each comprises a two-stage control unit for producing step-wise movement having a larger stroke and a smaller stroke. The ratio between the strokes is preferably approximately 10:1.

BRIEF DESCRIPTION OF THE DRAWINGS

One embodiment of the apparatus according to the present invention is shown schematically in the drawings and shall be described hereinafter. In the drawings.

DETAILED DESCRIPTION OF THE PREFERRED EMBODIMENTS

Figure 1:
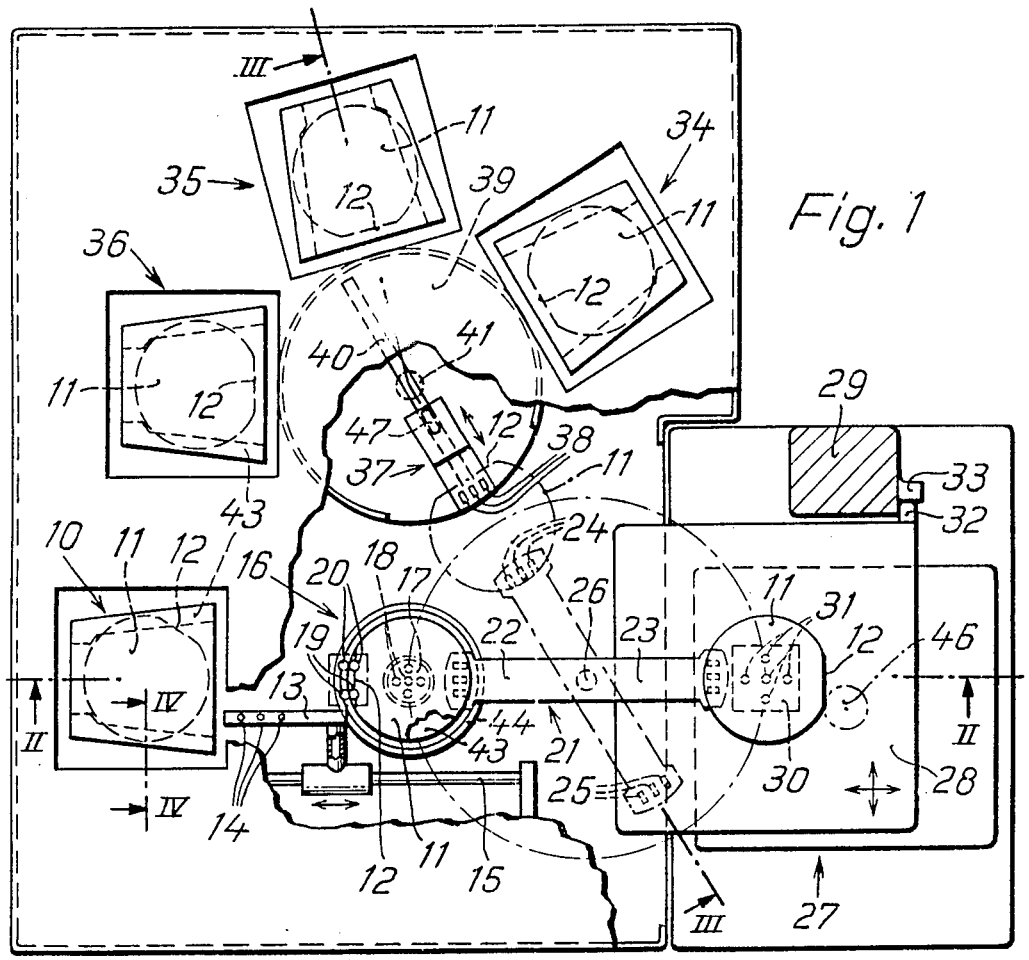
FIG. 1 shows a top view of the device.

According to the present invention, between the discharge cassette and the position aligning station, a linearly displaceable transport arm is positioned for eccentrically gripping the disk shaped objects. Between the position aligning station and the inspection table, a pivoting lever is positioned for gripping the disk shaped objects eccentrically, and within the working range of the pivoting lever a displaceable slide, mounted on a rotating plate, is provided for eccentrically gripping the disk shaped objects. Depository cassettes are arranged with their orifices on the circumference of the rotating plate for receiving objects from the slide. In the preferred embodiment, the layout is such that the discharge cassette, the position aligning station and the inspection table are aligned with each other in the course of the transfer of the object and the rotating axis of the pivoting lever coincides with the alignment.

According to the invention a wafer disk, for example, is lifted by means of the transport arm from the cassette and, while resting on the transport arm, is carried to the position adjusting station. The inner space of the cassette widens toward the orifice so that the edge of the wafer disk is located in a completely free manner in space immediately following the onset of the transport process. Since the transport arm may have a very flat configuration, it reaches between the cassette and the table supporting it. The configuration of the table is thus independent of the mechanical elements of the transportation system.

In the position adjusting station the wafer disk is placed in a known manner onto a suction table. The disk is taken up after alignment by the pivoting lever and placed in a known manner onto a suction block of the inspection table. After inspection, the same pivoting lever carries the wafer disk to a slide which is mounted for radial movement on the rotation plate. The slide receives the disk and the plate turns in the direction of the depository cassette provided, at which point the slide reinserts the wafer into a cassette. In this manner, the wafer is carried freely in space to the end of the automatic transport system. In the process, the direct deposition of the wafers into preselected cassettes is particularly important, as there are no additional transfer points to pass. The pivoting lever with its three receiving and discharge positions serves as the central element for the distribution of the wafer disks. Each of the three functional areas of the device, wafer take-up/position alignment, inspection and deposition, may be thus aligned independently with the position of the pivoting lever involved.

A significant contribution to the reduction of the risk of contamination related to transportation is achieved by the fact that all of the gripping elements are directed toward the bottom side of the disk shaped objects. This is true, in contrast to the known installations, also for the step of the position oriented transfer of the disks. Suction nozzles are provided advantageously as the gripping elements. Appropriately, a plurality of suction nozzles are arranged in succession in the direction of displacement on the transport arm. On the pivoting lever, they should be arranged on its outer end in the direction of the pivoting circle, adjacent to each other. On the slide the suction nozzles are placed adjacently to each other on one end of said slide, perpendicularly to its direction of displacement. These measures result in the fact that the disks are gripped exlusively unilaterally in a peripheral manner on their bottom side. The center area of the bottom side of the disk remains free in this layout for deposition in the position adjusting station and on the inspection table and transfer of the disks from one carrier to the other is possible without mutual interference.

The working process may be accelerated by equipping the pivoting lever with at least two arms of equal length, so that, for example, a disk may be taken simultaneously from the position adjusting station and from the inspection table. Separate actuating means for the suction nozzles associated with the ends of the pivoting lever arms makes it possible to transfer disks taken up by the arms at different times.

The danger of photoresist spalling at the edges of the disks upon removal from the cassettes may be further reduced if the cassette is slightly lowered after a disk is transferred to the transport arm so that there is no further contact between the disk and the compartment of the cassette. This is achieved by using a step-wise height adjustment mechanism. The mechanism includes a two-step control element which produces a larger stroke followed by a much smaller stroke. The ratio of the two strokes is approximately 10:1. This two-step height control may be applied also to the introduction of the disks into the depository cassettes.

In order to control the automatic transport process, it is necessary to determine, for example, whether the transport arm has taken a wafer disk from the cassette or whether it has entered an empty compartment. For this purpose, in the transport path of the disk shaped objects between the discharge cassette and the position adjusting station a photoelectric sensor is arranged. The optical axis of the sensor is located outside the path of displacement of the transport arm. In this manner it is assured that only a loaded transport arm will activate a signal of the photoelectric barrier.

The aforementioned easy alignment of the apparatus makes it possible to provide initially a separate inspection unit with an inspection table. This may consist for example of a free-standing microscope.

A further appropriate combination of functional units consists of combining in a first module the height adjustable support for the discharge cassette, the position adjusting station, the transport arm and the pivoting lever; in a second module, the rotating plate with the slide and the height adjustable supports for the depository cassettes; and in a third module the inspection instrument with the inspection table. These modules may be arranged in a common base plate equipped with prealigned supports for the modules.

FIG. 1 shows a discharge cassette 10 containing wafer disks 11, each having a flat portion 12 oriented arbitrarily in the cassette 10. A transport arm 13 having suction nozzles 14 arranged on its upper side is mounted in a linearly displaceable manner on a guide 15.

As can be seen from FIG. 1, transport arm 13 is laterally spaced from and extends parallel to a line between the center of cassette 10 and the center of a position adjusting station 16. Similarly, guide rail 15 extends from a position adjacent cassette 10 past position adjusting station 16 parallel to and laterally spaced from a line between the centers of the cassette and the position adjusting station.

Figure 2:
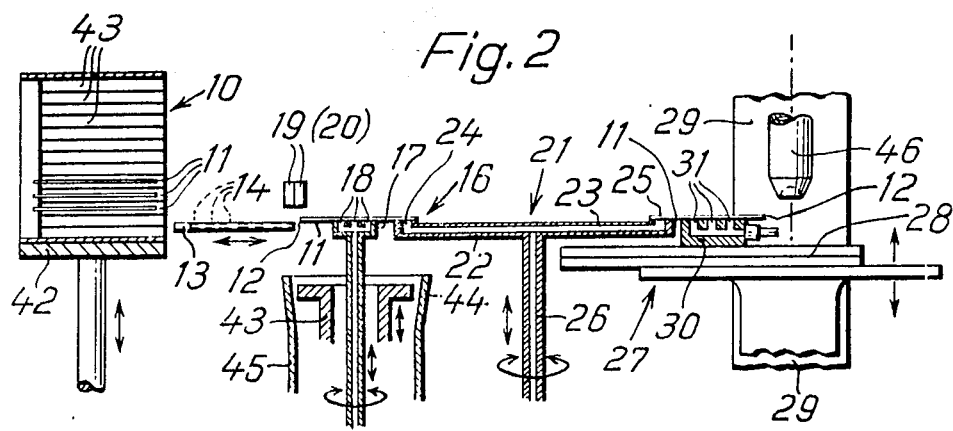
FIG. 2 shows a section through the transport path from the discharge cassette to the inspection table (II—II)

A position adjusting station 16 contains a suction table 17 with upwardly directed suction nozzles 18. As shown in FIGS. 1 and 2, two reflective type photoelectric sensing devices 19 and 20 are associated with the position adjusting station 16. Sensing devices 19 and 20 serve in a known manner to determine the position of a flat portion 12 (as will be described in further detail hereinafter), and further serve to detect a wafer disk resting on the transport arm 13. A pivoting lever 21 has two arms 22, 23, on the outer ends of which are arranged several suction nozzles 24, 25. Nozzles 24, 25 are positioned adjacent to each other in the pivoting direction and face upwardly. The pivoting lever 21 may be rotated around an axle 26, which is adjustable in height. An inspection table 27 is provided having a mechanical stage 28 and a microscope 29. Mechanical stage 28 is displaceable in two coordinate directions relative to microscope 29. For this purpose, a suction block 30 with upwardly directed suction nozzles 31 is arranged on the stage 28. Angular stops 32, 33 are provided on the microscope 29 and the mechanical stage 28 to define the wafer transfer position of the stage 28.

The discharge cassette 10, the position adjusting station 16 and the inspection table 27 are aligned with each other in the wafer transfer position. The pivoting axis 26 intersects the alignment. A slide 37 serves to introduce the wafer disks 11 into different depository cassettes 34, 35, 36. Slide 37 has upwardly directed suction nozzles 38 on one end and is further displaceable in the radial direction, longitudinally in a slot 40, in a rotating plate 39. In the wafer transfer position, the direction of displacement of the slide 37 and the longitudinal axis of the pivoting lever 21 are aligned with each other. In operation, slide 37 extends to receive a wafer disk 11, and then returns on the rotating plate 39 so that the wafer 11 no longer projects past the edge of the rotating plate 39. After this, the rotating plate 39 turns around its axle 41 until the slot 40 points to the depository cassette into which the wafer is to be introduced. For this purpose the slide 37 again moves forward in its guide 40, as shown more clearly in FIG. 3.

Figure 4:
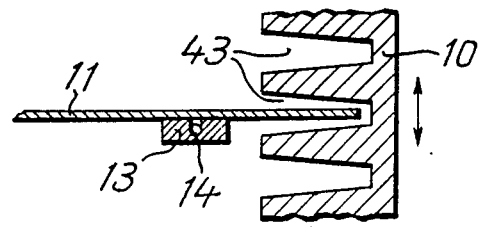
FIG. 4 shows a view of a detail of the discharge cassette during the discharge process (IV—IV).

As shown in FIG. 2, cassette 10 is mounted on a table 42 that may be adjusted in height in a stepwise manner, for example, by means of a cam mechanism. By the stepped lowering of the table 42 the wafers 11 located in the compartments 43 are brought in the discharge position successively, one by one. The walls of the compartments are slightly conical, as seen in FIG. 4. The rest positions of the table 42 are set so that in each rest position, the bottom side of one wafer is located slightly above the upper side of the transport arm 13, whereby the transport arm 13 may enter the cassette 10 without touching the wafer 11. After this, the table 42 is again slightly lowered, and the transport 13 then grips the wafer by suction. The wafer is thus lifted from its support in the compartment without hitting the upper wall of the compartment (FIG. 4).

While the transport arm 13 carries the wafer to the suction table 17, the cassette 10 is lowered by a furher step. The suction table 17 is adjustable in height and may be rotated around its axis. Table 17 is initially lowered until the transport arm 13 has brought the wafer into the transfer position. After this, the suction table 17 is raised until it contacts and grips the wafer disk by suction. Simultaneously, the suction of the transport arm 13 is released. Following the receipt of the wafer, the suction table 17 is again slightly raised and the transport arm 13 returned to the discharge position at the cassette.

If the photoelectric sensor 19 has not produced a signal during the first transport run of the transport arm 13, the discharge process is repeated until the sensor 19 emits a signal indicating that a wafer has been moved into the transfer position.

After the transfer, the wafer 11 is located randomly on the suction table 17 both in relation to its x-y alignment and its angular position. To effect adjustment of the x-y position of the wafer, the suction table 17 is lowered, and its suctional grip is released. The wafer is then transferred freely to a ring 43, which again may be lowered in a cylinder 45 having a funnel shaped upper part 44. The internal diameter of the cylinder 45 corresponds to the diameter of the wafer so that the wafer is automatically centered during its descent. After this, the suction table 17 is raised to its highest position and grips the wafer disk by suction upon its approach.

The flat portion 12 ground onto the wafer serves to define a certain angular position. The photoelectric sensors 19 and 20 are arranged so that they are able to recognize the flat portion 12 during rotation of the suction table 17. When the desired angular position is attained the suction table 17 is immobilized with the wafer being held by suction. It is obviously also possible to provide further photoelectric sensors offset by 90°, to be able to selectively detect another orientation.

During the position adjusting process the pivoting lever 21 is in its waiting position indicated by a broken line in FIG. 1. Following the completion of the wafer alignment on suction table 17, lever 21 pivots under the wafer thus aligned. The height of lever 21 is maintained such that damage to the wafer is not possible. The pivoting arm 21 is then raised under the wafer only until it is able to grip the wafer by suction, and the suction of the suction table 17 is released. The positional adjustment of the wafer is safely maintained when the pivoting lever is again slightly raised in order to lift the wafer from the suction table. Obviously, it is possible to lower the suction table for this purpose.

During transfer of a wafer 11, the mechanical stage 28 is in the position defined by the stops 32, 33 and at a height at which the surface of the suction block 30 is located under the pivoting plane of the pivoting lever 21. To transfer the wafer to the stage 28, the pivoting layer 21 rotates by 180° around the axle 26. The transfer of the wafer is effected by the mutual relative adjustment in height between arm 21 and stage 28, and the switching of the suction from arm 21 to block 30. After transfer to block 30, the wafer 11 is located in a definite orientation such that the stage 28 may be moved in the focus of the objective 46 on the microscope 29. The pivoting arm 21 is returned to its waiting position at this time.

On the stage 28, a motor drive (not shown) may be provided for the fine alignment of the suction block 30, in order to further align the structures to be inspected on the wafer during a predetermined inspection procedure. The inspection procedures may be rendered reproducible for all wafers by means of a manually operated link motion of the stage. Alternatively, the inspection procedure may also be effected by means of program controlled stepping motors. An automatic focusing device holds the wafer automatically in the focus of the inspection instrument. The evaluation of the structures observed may be effected visually, photometrically or by image analysis methods. The result of the inspection is entered in the process control as the control signal for further transport process and is used to determine the depository cassette in which the inspected cassette is to be placed.

Figure 3:
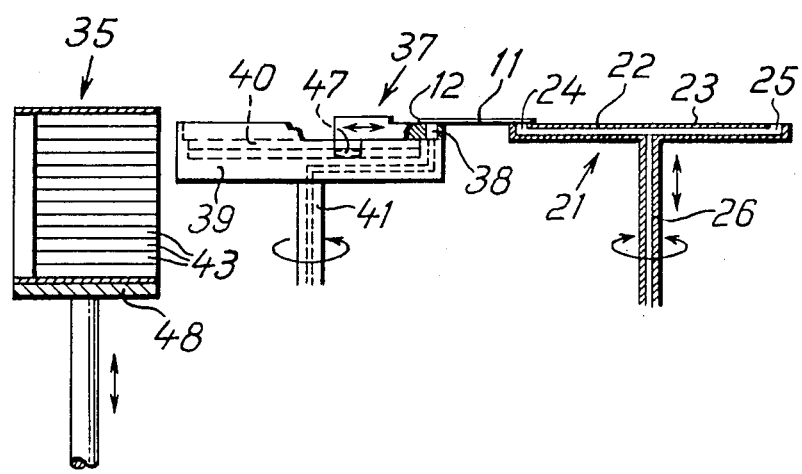
FIG. 3 shows a section through the transport path from the pivoting lever to the depository cassette (III—III)

The concluding transport process will now be described with reference to FIG. 3. The pivoting lever 21 accepts the wafer 11 from the suction block 30 after the stage 28 has been returned against the stops 32, 33. The transfer position of the pivoting lever 21 with respect to the slide 37 in the example shown coincides with its aforementioned waiting position.

As the rotating axle 41 of the rotating plate 39 is not adjustable in height, the transfer of the wafer to the slide 37 is effected by the lowering and subsequent raising of the pivoting lever 21. The slide 37 is guided for example by means of a cam 47 in the slot 40. The diameter of the rotating plate 39 and the radial path of the slide 37 are dimensioned so that even the largest wafer disks encountered may be drawn completely onto the rotating plate.

The depository cassettes 34, 35, 36 are arranged on a table 48 which can be adjusted in height so that the wafers inserted by the slide 37 do not contact the compartment walls. Once the wafer has been completely inserted, the cassette table 48 is raised slightly until the disk rests on the wall of the compartment and the suction of the slide 37 is released. The slide 37 is then drawn back onto the rotating plate 39. The table 48 travels to its next receiving height and a transport cycle is completed.

It should be noted that by using the two-arm configuration of the pivoting lever 21 the removal of an inspected wafer from the inspection table 27 and the transfer of a new wafer from the suction table 17 may be performed simultaneously. The inspected wafer is then held until the pivoting lever 21 is in the transfer position with respect to the slide 37. During the inspection of a new wafer the position of a further wafer disk may be made and the inspected wafer transported to a depository cassette.

In an operation where not all disks are inspected, the wafer disks may be brought directly from the suction table to the slide 37. This is advantageous in the case of random sampling inspections.

The operation of the present invention has been described hereinabove as it applies to the field of semiconductor technology. Obviously, however, other disk shaped objects that are to be inspected in series may also be handled by the present invention if human contact with the surfaces is undesirable. For example, the present invention may be used in connection with biological or other preparations resting on an object carrier which preparations pose a risk of infection during manual transport.

Further, it should be apparent that numerous modifications to the present invention could be made without department from the scope thereof, as set forth in the appended claims.

What is claimed is:

1. A device for operating on disk shaped objects comprising a disk cassette, means for adjusting the height of said cassette, a position adjusting station, an inspection station, and means for automatically transporting said disk shaped objects along a path from said disk cassette through said position adjusting station to said inspection station and from said inspection station to a receiving cassette, said transporting means comprising:

a linearly displaceable transport arm mounted between said disk cassette and said position adjusting station and extendable into said disk cassette from the side facing said position adjusting station, said transport arm being laterally spaced from and extending parallel to a center line of said path along which said disk shaped objects are transported from said cassette to said position adjusting station;

means on said linearly displaceable transport arm for eccentrically gripping one of said disk shaped objects;

means at said position adjusting station for centrally gripping the bottom of a disk shaped object;

a pivotal lever having a working range between said position adjusting station and said inspection station; and means of said pivotal lever for eccentrically gripping one of said disk shaped objects.

2. A device according to claim 1, wherein the disk cassette, the position adjusting station and the inspection table are linearly aligned with each other during transfer of a disk shaped object and wherein said pivoting lever has a pivoting axle which coincides with the alignment.

3. A device according to claim 1, wherein all of said eccentrically gripping means are positioned for engaging the bottom sides of the disk shaped objects.

4. A device according to claim 3, wherein all of said eccentrically gripping means comprise suction nozzles.

5. A device according to claim 1, wherein said pivoting lever is adjustable in height and has at least two arms of fixed, equal length, and wherein said eccentrically gripping means comprises separately actuatable suction nozzles associated with each of said arms.

6. A device according to claim 1, wherein said inspection table is a part of a separate inspection instrument.

7. A device according to claim 1, wherein the system comprises a plurality of modules including: a first module comprising said means for adjusting the height of said disk cassette, said position adjusting station, said transport arm and said pivoting lever; and another module comprising said inspection station.

8. A device according to claim 7, wherein a common base plate is provided to support the modules in a mutually aligned configuration.

9. A system for operating on disk shaped objects comprising a disk cassette, means for adjusting the height of said cassette, a position adjusting station, an inspection table, and means for automatically transporting said disk shaped objects along a path from said disk cassette through said position adjusting station to said inspection station and from said inspection station to a receiving cassette, said transporting means comprising:

- a linearly displaceable transport arm laterally spaced from and extending parallel to a center line of said path along which said disk shaped objects are transported, said transport arm being movable between said disk cassette and said position adjusting station;
- a guide for said transport arm laterally spaced from and extending parallel to said path from said disk cassette past said position adjusting station, said transport arm entering said disk cassette from the side facing said position adjusting station;
- means on said linearly displaceable transport arm for eccentrically gripping one of said disk shaped objects;
- a pivotal lever having a working range between said adjusting station and said inspection station; and
- means on said pivotal lever for eccentrically gripping one of said disk shaped objects.

10. A system for operating on disk shaped objects comprising a disk cassette, means for adjusting the height of said cassette, a position adjusting station, an inspection table, and means for automatically transporting said disk shaped objects along a path from said disk cassette through said position adjusting station to said inspection station and from said inspection station to a receiving cassette, said transporting means comprising:

- a linearly displaceable transport arm laterally spaced from and extending parallel to a center line of said path along which said disk shaped objects are transported, said transport arm being movable between said disk cassette and said position adjusting station;
- means on said linearly displaceable transport arm for eccentrically gripping one of said disk shaped objects;
- means at said position adjusting station for centrally gripping the bottom of a disk shaped object;
- a pivotal lever having a working range between said position adjusting station and said inspection station;
- means on said pivotal lever for eccentrically gripping one of said disk shaped objects; and
- means extensible into the working range of said pivotal lever for receiving a disk-shaped object from said pivotal lever and transporting the received disk-shaped object to said receiving cassette.

11. A device according to claim 1, wherein said transport arm which is extendable into said disk cassette is formed sufficiently flat that it can be extended between two adjacent disk shaped objects in said cassette without contacting either of the two adjacent disk shaped objects.

12. A device according to claim 5, wherein said two arms are directed at an angle of 180° to each other.

* * * * *